US005676305A

United States Patent [19]
Potter et al.

[11] Patent Number: 5,676,305
[45] Date of Patent: Oct. 14, 1997

[54] METHOD TO ACHIEVE REGULATED FORCE CONTACT IN PIN TRANSFER DEPOSITION OF LIQUIDUS SUBSTANCES

[75] Inventors: Scott G. Potter, Coconut Creek; Barry B. Groman, Margate; Everett Alan Clayton, Ft. Lauderdale, all of Fla.

[73] Assignee: Motorola, Inc., Schaumburg, Ill.

[21] Appl. No.: 634,575

[22] Filed: Apr. 18, 1996

[51] Int. Cl.$^6$ .................................................. H05K 3/34
[52] U.S. Cl. ...................................... 228/207; 228/223
[58] Field of Search ................................. 228/207, 223, 228/180.22, 248.1, 33

[56] References Cited

U.S. PATENT DOCUMENTS

| | | | |
|---|---|---|---|
| 5,315,070 | 5/1994 | Maiwald | 174/250 |
| 5,435,481 | 7/1995 | Da Costa Alves et al. | 228/223 |
| 5,540,379 | 7/1996 | Sofia et al. | 228/223 |

Primary Examiner—Samuel M. Heinrich
Attorney, Agent, or Firm—Dale W. Dorinski; Glenn E. Gold

[57] ABSTRACT

A method for depositing a tacking agent (18) onto a circuit-carrying substrate (e.g., a printed circuit board) (22) such that a regulated volume is simultaneously deposited at multiple substrate sites (24). A first input pressure, P1, introduced through a bladder inlet (12), is supplied to a compliant bladder (14) which is in contact with a plurality of transfer pins (16). The compliant bladder imparts a substantially equal force to each of the transfer pins. The pins are then dipped into a thin film of tacking agent and removed. Subsequently, the first input pressure, P1, is adjusted to a second input pressure, P2, sufficient to force the pins to a uniform maximum extension. Finally, the second input pressure, P2, is adjusted to a third input pressure, P3, which imparts a predetermined uniform force on each of the pins, and the pins are brought in contact with the printed circuit substrate deposition sites. Thus, a uniform, predetermined volume of tacking agent is transferred to each of the board deposition sites, by regulating the force applied to the plurality of pins.

15 Claims, 5 Drawing Sheets 5,676,305

METHOD TO ACHIEVE REGULATED FORCE CONTACT IN PIN TRANSFER DEPOSITION OF LIQUIDUS SUBSTANCES

TECHNICAL FIELD

This invention relates in general to a method for selectively depositing a substance onto a substrate, and in particular to a method for regulating pin contact force during pin transfer deposition of solder flux onto a printed circuit board.

BACKGROUND

The process of soldering electronic circuitry involves placing and soldering leaded and leadless components onto a printed circuit board. During the assembly process, components must be maintained in their proper positions prior to and during the soldering operation. In the case of leaded components, leads inserted into holes in the printed circuit board serve to aid in fixturing the component in place during the soldering operation. In leadless or surface mount device (SMD) soldering, there exists a need to fixture the components so that they remain in place and do not move about during board assembly.

Leadless or SMD component fixturing is generally accomplished by the use of an adhesive strategically placed underneath or alongside the component. Prior to SMD placement, the printed circuit substrate is prepared by either stenciling (i.e., screen printing) solder paste, or by solid solder deposition (SSD). Reflow-solderable SMD printed wiring boards that have pre-applied solder, and can be equipped with SMD devices directly and then soldered by a reflow soldering process, are desirable. Solid solder deposition (a.k.a. "solder cladding") has become increasingly popular, since it places the onus of solder paste printing on the board fabricator and generally results in planarized solder surfaces for component placement. Two SSD processes, well known in the art, are Optipad®, developed by SMW Electronik (Germany), and Sipad®, developed by Siemans. U.S. Pat. No. 5,315,070 provides a comprehensive summary of some commonly-used solder deposition processes.

Regardless of the solder application method employed, an adhesive is normally dispensed or deposited onto the printed circuit board, and the components are then placed in the adhesive. The adhesive is cured either thermally or with ultraviolet light. Again, regardless of the solder application method, a solder flux of some sort must be provided in order to facilitate sound metallurgical solder joints. In the case of solder paste, flux is typically formulated into the solder paste. In the case of SSD, flux is generally applied to individual solder deposits. A sufficient volume of flux deposited onto SSD sites will generally provide adequate tackiness for component fixturing. Since solder paste is not used, some other means of providing a solder flux to the solder must be incorporated. Many approaches have been seen in the prior art, such as: point-to-point dispensing; screen printing; spraying; micro-jetting; and so forth. These approaches contain flaws, including: inflexibility to product variation; long application cycle times; variations in the deposited volume of solder flux; missing or absent flux deposits; and high equipment maintenance—all of which result in poor performance at the assembly level. A more efficient method for depositing flux to solder-cladded printed circuit boards, detailed in U.S. Pat. No. 5,435,481, utilizes an array of pins to transfer flux from a flux bath to an array of solder clad sites. Still, this method can be improved upon.

It would be desirable to consistently deposit a sufficient volume of flux at individual SSD sites in a more timely manner. Syringe dispensing, a common method of flux deposition, has proved to be insufficient due to its inherent time delay. The prior art has made progress addressing this time delay by simultaneously depositing flux at multiple solder clad sites using pins. U.S. Pat. No. 5,435,481, incorporated herein by reference, discloses a process of dipping an array of pins into a bath of flux and then depositing the flux onto a printed circuit board. Although the cited prior art reduces flux transfer times, it still requires a dwell time of 5 seconds or more while the pins contact respective deposition sites. The dwell time is necessitated by inconsistent pin-to-board contact forces; lower than desired contact forces result in slower flux transfer and sometimes insufficient flux transfer volumes (illustrated by FIG. 1). A need remains for a method to consistently deposit a predetermined, uniform, volume of flux to multiple printed circuit sites in a more timely manner. Thus, further improvement is desirable.

DETAILED DESCRIPTION OF THE PREFERRED EMBODIMENT

Figure 1:
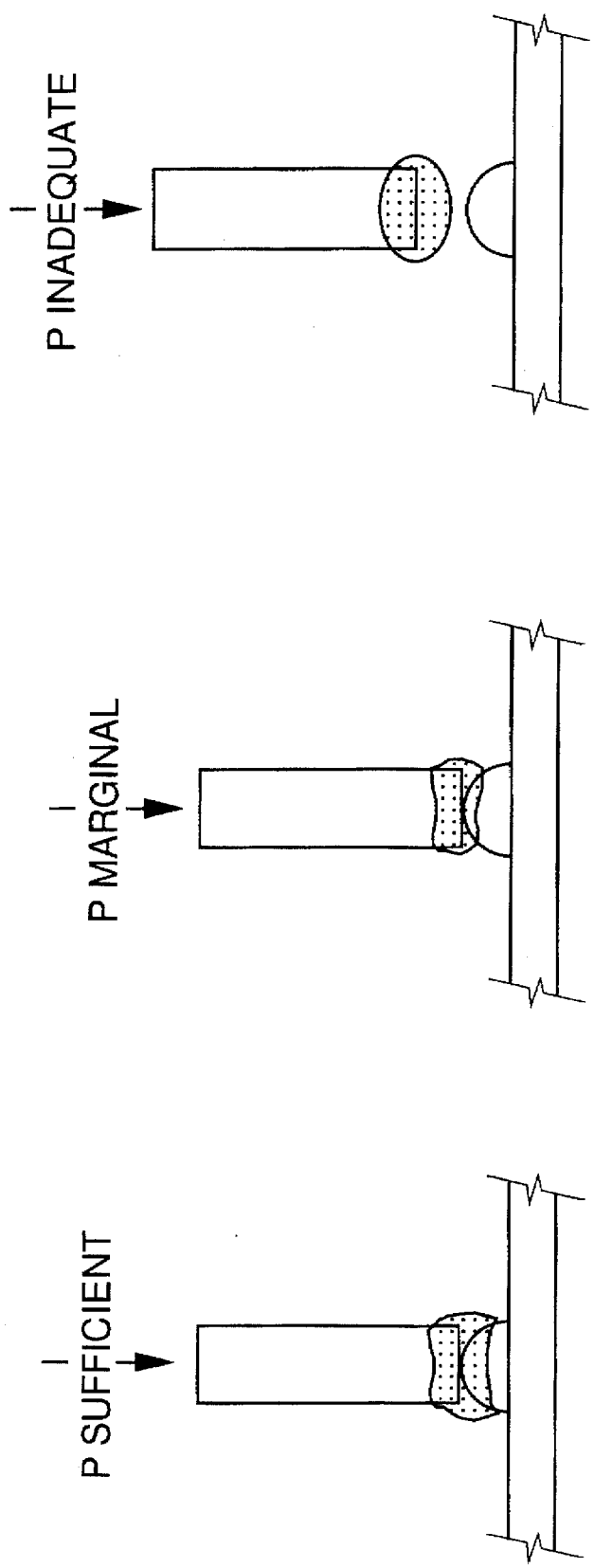
FIG. 1 is a side view of an isolated pin depositing flux at a solder deposition site, illustrating the variability of flux transfer, as practiced in the prior art.

An improved method simultaneously deposits a desired uniform volume of a liquidus substance, such as a tacking agent or flux, to multiple printed circuit substrate locations. A pressure-regulated compliant bladder contacts a plurality of flux transfer pins, equally distributing a resultant force among the pins. With a uniform first force applied by the bladder to the pins, the pins are dipped into a liquidus substance, such as a thin film of tacking agent or flux, and removed. A first internal gas pressure, previously applied to the bladder, is then adjusted (e.g., increased) to a level sufficient to force the plurality of pins to a uniform maximum extension. Subsequently, the bladder pressure is readjusted (e.g., reduced) to apply a known force to the pins, previously determined to result in the transfer of an optimal volume of tacking agent. Finally, the pins are brought into contact with the target substrate and immediately removed, resulting in the swift transfer of tacking agent from the pins to the solder deposition sites, or solder-cladded portions, on the printed circuit substrate.

While the specification concludes with claims defining the features of the invention that are regarded as novel, it is believed that the invention will be better understood from a consideration of the following description in conjunction with the drawing figures, in which like reference numerals are carried forward.

The process for soldering surface-mounted components using solid solder deposition (SSD) is a rapidly-evolving technology. Many techniques for the application of the solder have been developed. One process, known as "solder cladding," utilizes circuit-carrying substrates or printed circuit boards that have a predetermined layer of solder applied to the solder pads. The layer of solder is of sufficient thickness so as to provide all the needed solder during the component reflow process. Typically, printed circuit boards are coated with a thickness of solder between 0.02 and 0.2 millimeters by the circuit board manufacturer. The use of solder cladding precludes the need to print solder paste or otherwise deposit solder on the printed circuit board during the assembly process, since the solder is deposited by the board supplier prior to assembly.

Figure 2:
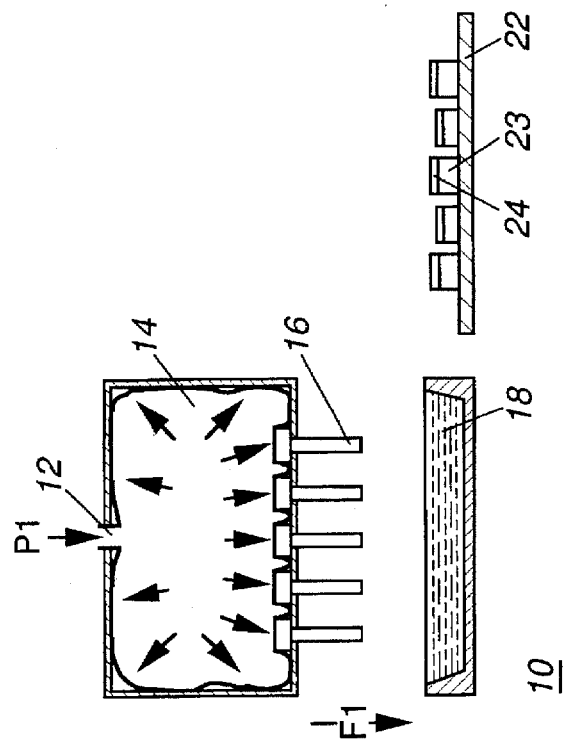
FIG. 2 is a side view illustrating the relative positions of the bladder, pins, and thin film of flux in their initial state, in accordance with the present invention.

Referring now to FIGS. 2 through 7, the steps used to carry out the methods of the instant invention are shown schematically. One of the first steps in the assembly process is to provide a substrate 22 with a plurality of deposition sites or solderable portions 23. For example, a circuit-carrying substrate 22 with a plurality of solder-cladded portions 23 may be used. Referring now to FIG. 2, the circuit-carrying substrate 22 has a plurality of component receiving pads 23 cladded with solder 24. Preferably, the circuit-carrying substrate 22 is a printed circuit board material made from one of a number of materials which are well known to those skilled in the art. Polyimide, FR4 and bismaleimide triazine (BT) epoxies are a just a few examples of commonly used printed circuit board materials. Typically, the substrate will contain a number of features, including, but not limited to: solder mask or resist; conductive vias; metal circuit traces; and solder-cladded metal pads. Obviously, all of these features are well known to those skilled in the art. A compliant bladder 14, a bladder pressure inlet 12, a plurality of pins 16, and a liquidus substance, such as a tacking agent or a thin film of flux 18, are also provided. One of the preferred methods of providing the thin film of flux is to doctor blade a film over a smooth substrate. Techniques for doctor blading films are well known in the art. The bladder pressure inlet 12 provides a means for supplying an internal bladder pressure. Preferably, a gas is used as the source of internal bladder pressure. Thus, in the preferred embodiment of the instant invention, internal bladder pressure is referred to as internal gas pressure.

Figure 3:
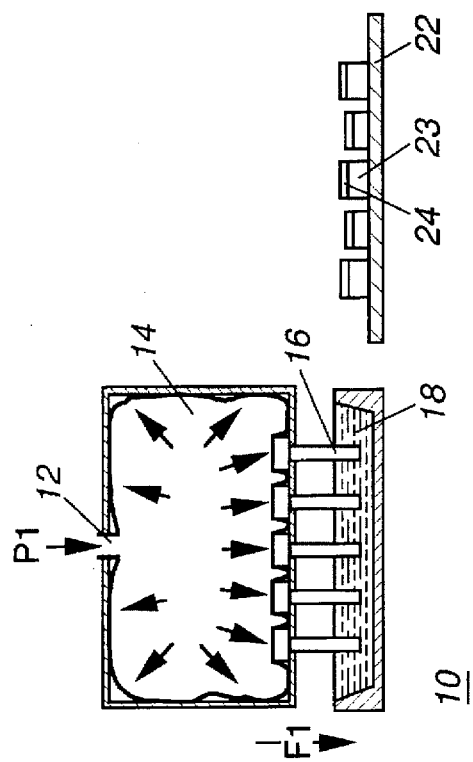
FIG. 3 is a side view of the pins dipped into the thin film of flux, following application of a first bladder pressure, P1.
Figure 5:
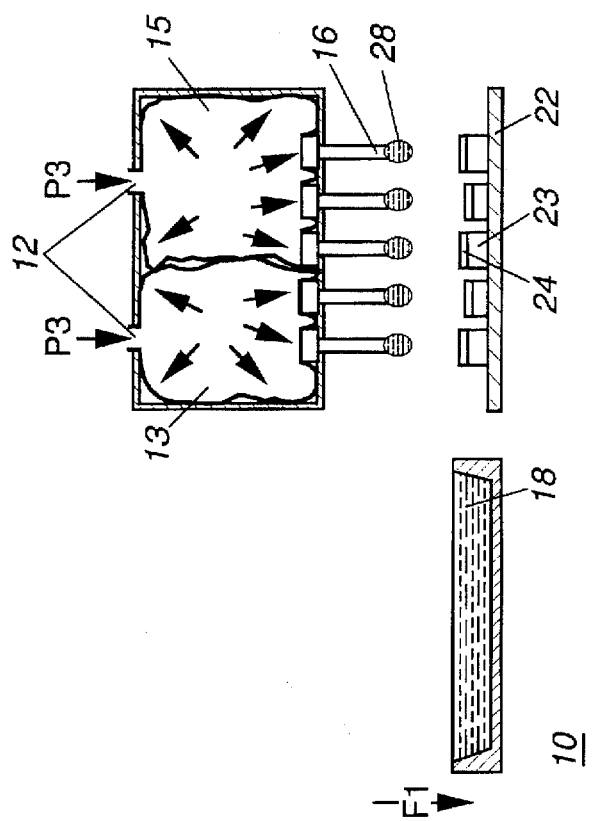
FIG. 5 is a side view of fully-extended flux-bearing pins, positioned over the relative solid solder deposits, following application of a third bladder pressure, P3.
Figure 4:
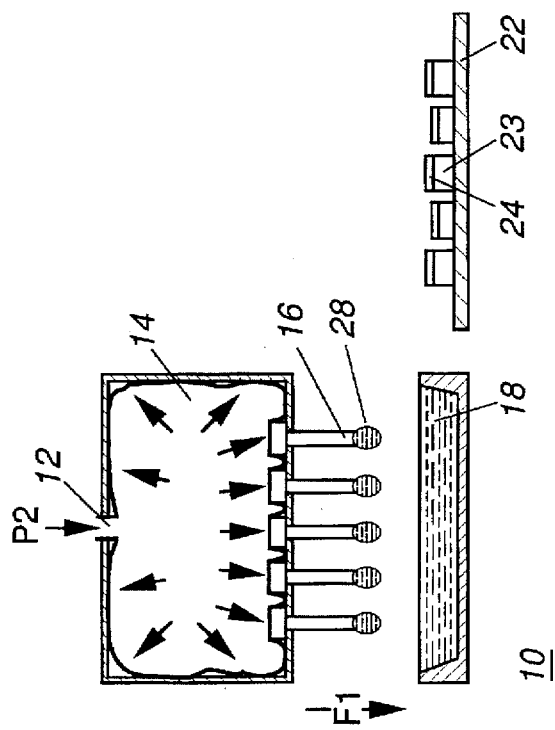
FIG. 4 is a side view of the fully-extended flux-bearing pins following their removal from the thin film of flux, and subsequent to the application of a second bladder pressure, P2.

Referring now to FIGS. 3 and 4, a first internal gas pressure, P1, is supplied to the compliant bladder 14, via the bladder pressure inlet 12, such that an outer surface of the compliant bladder exerts a uniform first force, F1, of $5(10)^{-3}$ to $2(10)^{-2}$ Newtons per pin, to the plurality of pins 16. Obviously, numerous means are available for supplying pressure, through the bladder pressure inlet 12, to the bladder 14. For instance, pressure may be supplied pneumatically or hydraulically. Since the first internal gas pressure, P1, is uniform throughout the bladder 14, a substantially uniform force, F1, is exerted to each of the plurality of pins 16, thus extending all pins exactly the same distance. In an alternate embodiment of the present invention (as shown in FIG. 5), application of force to the plurality of pins 16 may be effected by more than one compliant bladder. For instance, where it is desirous to reduce the total force applied by the pins 16 to the circuit-carrying substrate 22, a first compliant bladder 13 and a second compliant bladder 15, each contacting only a portion of the plurality of pins, may be engaged in a non-simultaneous fashion. The plurality of pins 16 are brought into contact with the thin film of flux 18, such that a substantially equal volume of flux is deposited on each pin, and the pins are removed from the flux. This transfer of flux onto the individual pins is accomplished substantially simultaneously if the entire array of pins 16 is placed into the film of flux 18 at one time. Following removal of the pins 16 from the flux 18, a portion of flux 28 is deposited on each pin. The bladder's first internal gas pressure, P1, is increased to a second internal gas pressure, P2, which increases the first force, F1, exerted by the outer surface of the bladder 14 against the pins to a corresponding second force, F2, from $2(10)^{-2}$ to $5(10)^{-2}$ Newtons per pin. The second force, F2, effectively levels the pins 16 by forcing them to a uniform maximum extension.

Referring briefly to FIG. 5, the array of pins 16, with portions of flux 28 adhering to the pins, are positioned directly above the corresponding solder-cladded portions 24 of the circuit-carrying substrate 22. Flux transfer tool movement is effected, for example, by means of an attached mechanical robotic arm (not shown). With the pins 16 directly above the corresponding solder-cladded portions 24, the second internal gas pressure, P2, is decreased to a third internal gas pressure, P3, which decreases the second force, F2, exerted by the outer surface of the bladders against the pins to a corresponding third force, F3, of less than $5(10)^{-2}$ Newtons per pin. The depiction of both a first bladder 13 and a second bladder 15 in FIG. 5 is intended to illustrate an alternate embodiment of the instant invention. The preferred embodiment of the instant invention incorporates a single compliant bladder 14.

Figure 7:
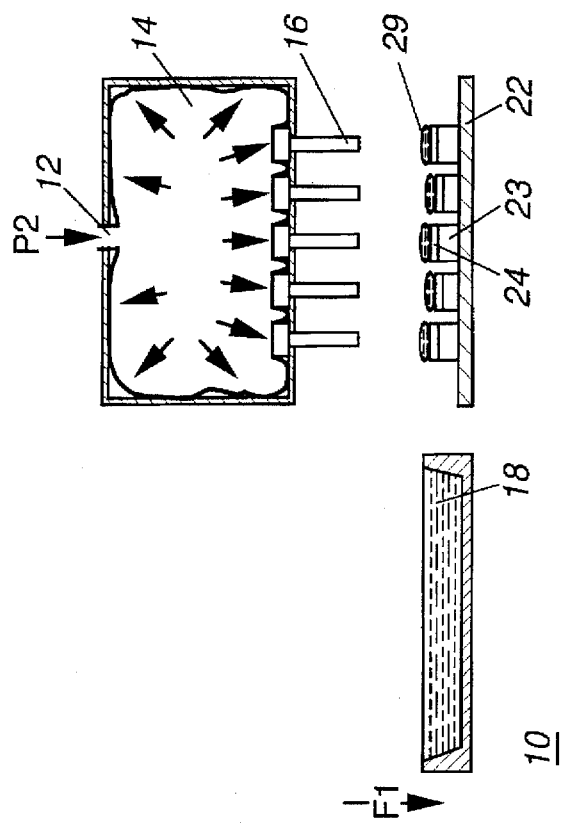
FIG. 7 is a side view of the printed circuit substrate with flux transferred from the pins to the solder deposits on the printed circuit substrate, and pressure subsequently reset to the second bladder pressure, P2.
Figure 6:
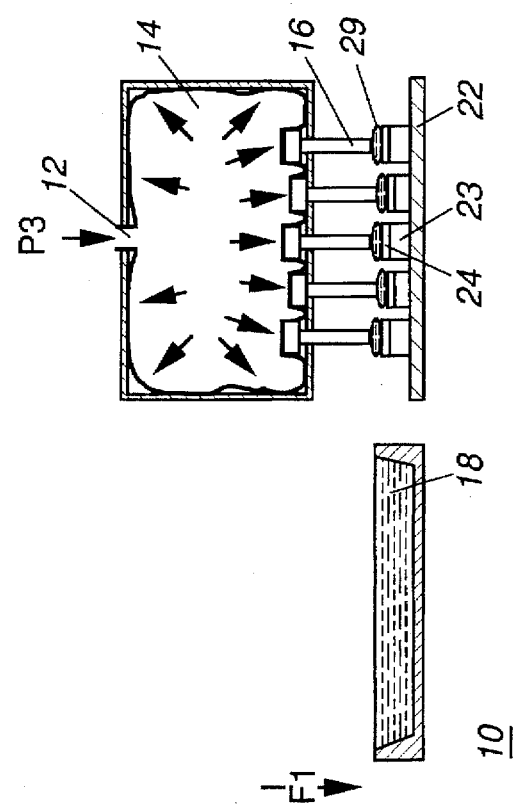
FIG. 6 is a side view of the flux-bearing pins making contact with solder deposits of varying height on a printed circuit substrate.

Referring now to FIGS. 6 and 7, the pins are lowered so as to contact the solder-cladded portions 24 of the substrate. Upon contact with the solder-cladded portions 24, the third force, F3, results in the deposition of flux 29 onto said solder-cladded portions. The compliant nature of the bladder 14, coupled with the uniform distribution of pin force, ensures that the pins 16 will conform to irregularities on an upper surface of the printed circuit substrate 22. For example, the pins 16 will conform to height variations in printed circuit board solder-cladded portions, such that a consistent volume of flux 29 will be deposited onto the individual solder-cladded portions 24. Subsequently, the plurality of pins 16 are retracted, leaving a predetermined volume of deposited flux 29 on each of the solder-cladded portions 24. Finally, the second internal gas pressure, P2, is re-applied to re-level the array of pins.

Figure 8:
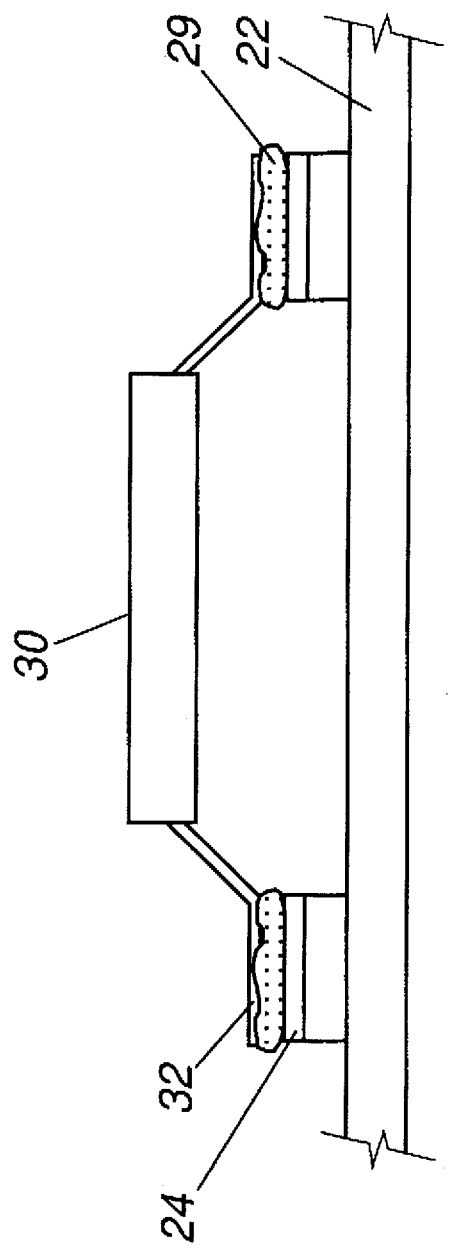
FIG. 8 is side view of an electronic component with at least one solderable surface, positioned atop flux-covered solder cladding on the surface of a printed circuit board, in accordance with the present invention.

Referring now to FIG. 8, a solderable surface 32 of an electronic component 30 is positioned on top of a flux deposit 29 which covers a solder-cladded portion 24 on the circuit-carrying substrate 22, and reflowed to form sound metallurgical solder joints. Those skilled in the art can appreciate the vast array of IC packages and discrete devices that may be soldered to a printed circuit board. For example, QFPs, TSOPs, PLCCs, resistors, capacitors, and coils are just a few.

As can now be readily understood, an improved method has been developed to deposit a tacking media, such as flux, on multiple solid solder deposition sites on a printed circuit substrate. With the implementation of the process of the instant invention, the pin transfer dwell time associated with the prior art is greatly diminished. Additionally, the occurrence of insufficient flux deposition, and corresponding occurrence of insufficient SMD solder joints, is drastically reduced. The result is an increase in board assembly cycle times coupled with a decrease in SMD solder joint related defects.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for depositing a liquidus substance, comprising the steps of:

providing a substrate having a plurality of deposition sites, and providing a liquidus substance, and providing a first compliant bladder, and providing a plurality of pins;

applying a first internal bladder pressure to the first compliant bladder such that an outer surface of the bladder exerts a uniform first force to the plurality of pins;

after the step of applying a first internal bladder pressure, and prior to a step of applying a second internal bladder pressure, dipping the plurality of pins into the liquidus substance so as to deposit a portion of the substance on each pin, and subsequently removing said pins from the liquidus substance;

applying a second internal bladder pressure to the first compliant bladder such that an outer surface of the bladder exerts a uniform second force to the plurality of pins which forces the pins to a substantially uniform maximum extension, then adjusting the second internal bladder pressure to a third internal bladder pressure, exerting a uniform third force to the pins, and then aligning the pins with the corresponding plurality of deposition sites; and after aligning the pins with the plurality of deposition sites, contacting the pins to the deposition sites so as to transfer the liquidus substance from each pin to each respective deposition site, then retracting the plurality of pins away from the deposition sites, and then re-applying the second internal bladder pressure.

2. The method described in claim 1, wherein a source of internal bladder pressure is pneumatic.

3. The method described in claim 1, wherein a source of internal bladder pressure is hydraulic.

4. The method described in claim 1, wherein deposition of the liquidus substance on an upper surface of the substrate is achieved by lowering the plurality of pins, from above the substrate upper surface, to contact the substrate deposition sites.

5. The method described in claim 1, wherein the first, second and third uniform forces are substantially the same.

6. The method described in claim 1, further comprising a second compliant bladder, wherein the first and second bladders each contact only a portion of the plurality of pins.

7. The method described in claim 6, wherein the first and second compliant bladders are not simultaneously pressurized to contact their respective portions of pins.

8. A method for transferring a tacking agent, comprising the following steps, in named order:

a) providing a circuit-carrying substrate having a plurality of solderable portions, and providing a liquid film of tacking agent, and providing a first compliant bladder, and providing a plurality of pins;

b) applying a first internal bladder pressure to the first compliant bladder such that an outer surface of the bladder exerts a uniform first force to the plurality of pins;

c) dipping the plurality of pins into the liquid film of tacking agent so as to deposit a portion of the tacking agent on each pin, and subsequently retracting the plurality of pins from the liquid film;

d) applying a second internal bladder pressure to the first compliant bladder such that the outer surface of the bladder exerts a uniform second force to the plurality of pins sufficient to force the pins to a substantially uniform maximum extension, aligning the pins with the plurality of solderable portions, and then adjusting the second internal bladder pressure to a third internal bladder pressure, such that a uniform third force is applied by the outer surface of the bladder to said pins; and e) contacting the plurality of pins to the solderable portions so as to transfer the portions of tacking agent on the pins to the respective solderable portions, retracting the pins away from the solderable portions, and re-applying the second internal bladder pressure.

9. The method described in claim 8, wherein the uniform third force is between $2(10)^{-2}$ and $5(10)^{-2}$ Newtons per pin.

10. The method described in claim 8, wherein the uniform third force is substantially the same as the uniform second force.

11. The method described in claim 8, wherein the uniform third force is less than the uniform second force.

12. The method described in claim 8, wherein the first, second and third uniform forces are substantially the same.

13. The method described in claim 8, further comprising a second compliant bladder, wherein the first and second compliant bladders each contact less than the full array of pins.

14. The method described in claim 13, wherein the first and second compliant bladders do not simultaneously contact portions of the plurality of pins.

15. A soldering process, comprising the following steps in named order:

a) providing an electronic component having at least one solderable surface, and providing a circuit-carrying substrate having a plurality of solder-cladded portions that are clad with a layer of solder between 0.02 mm and 0.2 mm thick, and providing a thin film of flux, and providing a compliant bladder, and providing a plurality of pins;

b) applying a first internal gas pressure to the compliant bladder such that an outer surface of the bladder exerts a uniform first force of $5(10)^{-3}$ to $2(10)^{-2}$ Newtons per pin to the plurality of pins;

c) dipping the plurality of pins into the thin film of flux so as to deposit a portion of the flux on each pin, and subsequently retracting the plurality of pins from the thin film of flux;

d) increasing the first internal gas pressure to a second internal gas pressure, such that an outer surface of the bladder exerts a uniform second force of $2(10)^{-2}$ to $5(10)^{-2}$ Newtons per pin to the plurality of pins, and then reducing the second internal gas pressure to a third internal gas pressure, resulting in a uniform third force between $2(10)^{-2}$ to $5(10)^{-2}$ Newtons per pin;

e) contacting the plurality of pins to the plurality of solder-cladded portions on the circuit-carrying substrate so as to transfer the portions of flux from the pins to the respective solder-cladded portions, leaving flux deposits on the solder-cladded portions, then retracting the pins away from the solder-cladded portions, and re-applying the second internal gas pressure to the bladder;

f) contacting the at least one solderable surface of said electronic component to the deposited flux covering the solder-cladded portions; and g) applying a temperature sufficient to reflow the solder-cladded portions, metallurgically bonding the at least one solderable surface of the electronic component to the solder-cladded portions of the circuit-carrying substrate.

* * * * *